United States Patent
Clara et al.

(10) Patent No.: US 7,486,155 B2
(45) Date of Patent: Feb. 3, 2009

(54) CIRCUIT AND METHOD FOR PULSE WIDTH MODULATION BY MEANS OF SYNCHRONIZED, SELF-OSCILLATING PULSE WIDTH MODULATORS

(75) Inventors: Martin Clara, Villach (AT); Andreas Wiesbauer, Poertschach (AT); Thomas Poetscher, Villach (AT); David San Segundo Bello, Villach (AT); Sergio Walter, Villach (AT)

(73) Assignee: Infineon Technologies AG, Neubiberg (DE)

( * ) Notice: Subject to any disclaimer, the term of this patent is extended or adjusted under 35 U.S.C. 154(b) by 53 days.

(21) Appl. No.: 11/760,066

(22) Filed: Jun. 8, 2007

(65) Prior Publication Data
US 2007/0286273 A1    Dec. 13, 2007

(30) Foreign Application Priority Data
Jun. 9, 2006    (DE)    ........................ 10 2006 026 906

(51) Int. Cl.
*H03K 7/08*    (2006.01)
*H03K 7/04*    (2006.01)

(52) U.S. Cl. ........................ 332/109; 332/106; 332/108
(58) Field of Classification Search ................. 332/106, 332/108–109, 127–128; 331/46, 55–56
See application file for complete search history.

(56) References Cited

U.S. PATENT DOCUMENTS

| 6,023,178 | A  | * | 2/2000 | Shioya et al. ................ 327/176 |
| 6,297,692 | B1 |   | 10/2001 | Nielsen |
| 7,119,629 | B2 |   | 10/2006 | Nielsen et al. |

FOREIGN PATENT DOCUMENTS

| DE | 697 26 592 T2 | 11/2004 |
| WO | WO 03/055060 A1 | 7/2003 |

* cited by examiner

*Primary Examiner*—Anh Q Tran
(74) *Attorney, Agent, or Firm*—Slater & Matsil, L.L.P.

(57) ABSTRACT

A pulse width modulator circuit has two self-oscillating pulse width modulators and a synchronization circuit for synchronizing the two self-oscillating pulse width modulators. It also comprises an auxiliary-signal generating circuit for generating an auxiliary signal which is coupled into the two self-oscillating pulse width modulators.

28 Claims, 8 Drawing Sheets

Inversion for the other channel

CIRCUIT AND METHOD FOR PULSE WIDTH MODULATION BY MEANS OF SYNCHRONIZED, SELF-OSCILLATING PULSE WIDTH MODULATORS

This application claims priority to German Patent Application 10 2006 026 906.3, which was filed Jun. 9, 2006 and is incorporated herein by reference.

TECHNICAL FIELD

The invention relates to circuits and methods for pulse width modulation by using synchronized, self-oscillating pulse width modulators. The invention can be used for converting power in a plurality of systems, particularly in line drivers, audio amplifiers and switched-mode power supplies.

BACKGROUND

Pulse width modulators convert an analog input signal into a sequence of pulses, the pulse length of which is proportional to the amplitude of the input signal. Due to the value discreteness of the output signal, pulse width modulation (PWM) provides for high efficiency of the power conversion and offers high linearity.

Conventional PWM modulators use a clock generator which predetermines the switching frequency of the PWM modulator. FIG. 1 illustrates a basic circuit for generating a PWM signal 1 from an analog input signal 2. To generate the PWM signal 1, a comparator 3 compares the input signal 2 with the triangular signal output by a triangular-signal generator 4. As long as the amplitude of the input signal 2 is greater than the amplitude of the triangular signal, the PWM signal has the signal value 1 and otherwise the signal value of the PWM signal is 0.

Furthermore, self-oscillating PWM modulators are already known. Self-oscillating PWM modulators are cost-effective since there is no clock generator. Self generation of the switching frequency can be achieved by feeding the PWM output signal back to the input of the PWM modulator.

One problem in self-oscillating PWM modulators consists in that variations of the switching frequency can occur. Variations of the switching frequency lead to distortions in the output signal of the PWM modulator. If a number of channels of a system are to be processed by means of a number of self-oscillating PWM modulators, additional problems arise due to the lack of synchronism of the self-oscillating PWM modulators.

It is already known, therefore, to synchronize a number of self-oscillating PWM modulators. Synchronization is effected by coupling the self-excited oscillations in the respective PWM modulators. The coupling can be carried out, for example, via the output signal (i.e., e.g., via the load) or via coupling to internal nodes of the self-oscillating PWM modulators. Synchronized, self-oscillating PWM modulators enable, e.g., a three-valued pulse-width modulated signal to be generated by combining the two two-valued PWM output signals or the amplification of multi-channel audio signals.

SUMMARY OF THE INVENTION

In one aspect, the invention specifies techniques that provide for effective synchronization of two (or more) self-oscillating PWM modulators.

A pulse width modulator circuit according to an embodiment of the invention comprises two self-oscillating pulse-width modulators, a synchronization circuit for synchronizing the two self-oscillating pulse width modulators and an auxiliary-signal generating circuit. The auxiliary-signal generating circuit generates an auxiliary signal which is coupled into the two pulse-width modulators. As a result of coupling the auxiliary signal into the two pulse width modulators, the synchronization circuit can ensure synchronism of the two self-oscillating pulse-width modulators even for small input signal levels.

The auxiliary signal can either be superimposed on the input signals of the pulse width modulators or coupled into the pulse width modulators at a suitable point separately from the input signals. In the latter case, it can advantageously be coupled into the pulse width modulators via the loop filters.

It can be preferably provided that the auxiliary signal generated by the auxiliary-signal generating circuit is coupled into the pulse width modulators only when the signal level of one or both input signals of the pulse width modulators is below a threshold value. The result is that when the input signal levels are above the threshold value, no loss of dynamic range can occur due to the auxiliary signal.

For this purpose, the pulse-width modulator circuit can comprise a measuring circuit for determining the signal level of one or both input signals.

The synchronization circuit preferably comprises a phase offset detector for determining a quantity which is characteristic of the skew between the signal pulse centers of the signals generated by the pulse width modulators, and a frequency control circuit for adjusting the frequency of the self-oscillating pulse width modulators in dependence on the quantity determined. By detecting and evaluating the interval between the signal pulse centers of the signals generated by the pulse width modulators, frequency errors or mismatches of the two self-oscillating PWM modulators can be corrected without causing non-linear distortions.

A further illustrative embodiment of the invention relates to a three-valued pulse width modulator which comprises a circuit for combining the two-valued output signals generated by the two self-oscillating pulse width modulators into a three-valued pulse-width modulated signal.

Embodiments of the invention also comprise a circuit arrangement comprising a digital data pump, a digital/analog converter following the digital data pump, and a pulse width modulator circuit, following the digital/analog converter, with two self-oscillating pulse width modulators and a synchronization circuit for synchronizing the two self-oscillating pulse width modulators. The circuit arrangement also comprises an auxiliary-signal generating circuit provided in the digital data pump, for generating an auxiliary signal which is coupled into the two pulse-width modulators.

BRIEF DESCRIPTION OF THE DRAWINGS

In the text which follows, the invention will be described in greater detail by means of illustrative embodiments and referring to the drawings, in which.

DETAILED DESCRIPTION OF ILLUSTRATIVE EMBODIMENTS

Figure 1:
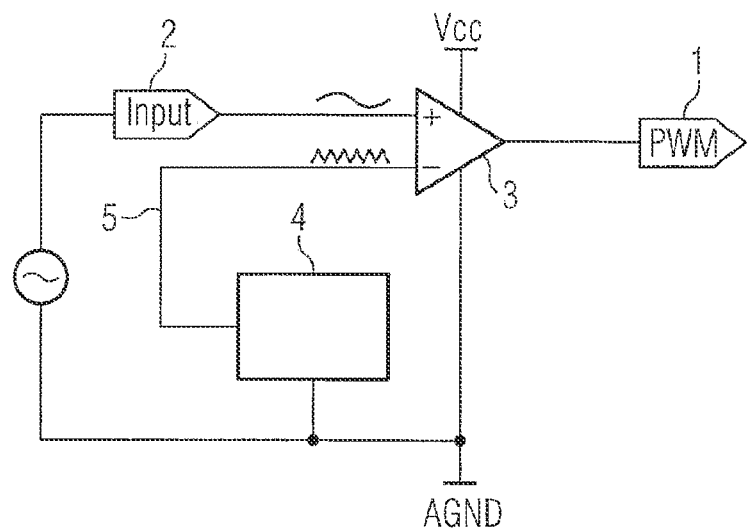
FIG. 1 shows a basic representation for explaining the generation of a PWM signal.
Figure 2:
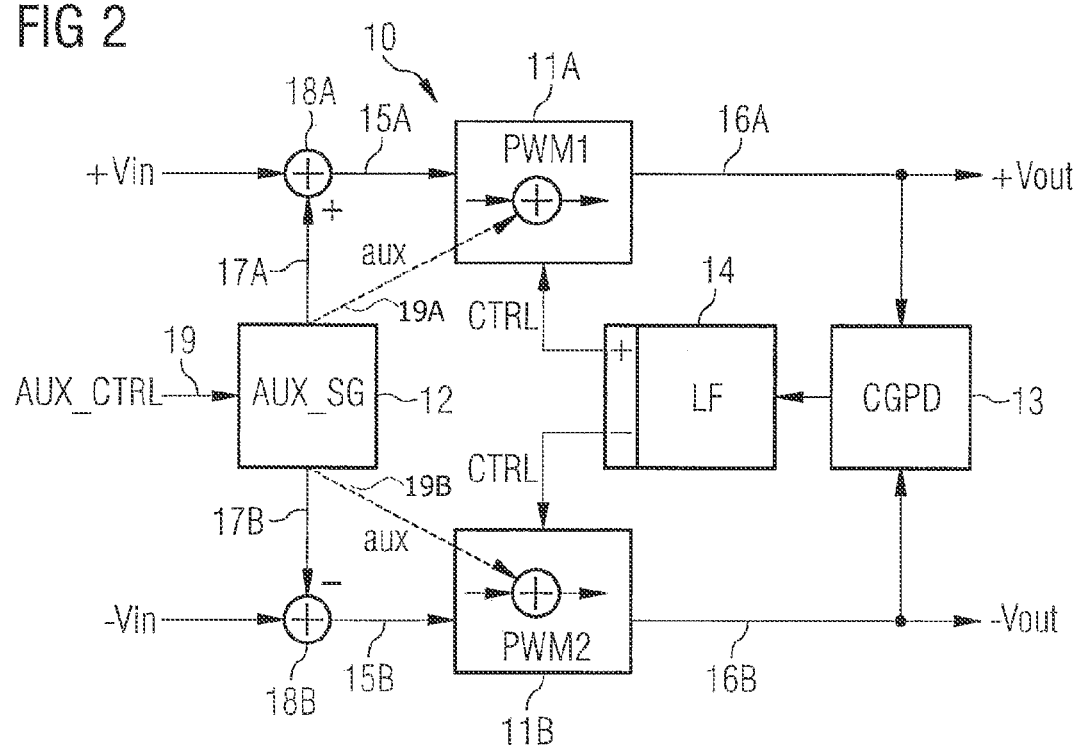
FIG. 2 shows a diagrammatic representation of an illustrative embodiment of the invention in the form of a block diagram.

According to FIG. 2, a pulse width modulator circuit 10 according to a first illustrative embodiment comprises a first PWM modulator PWM1 11A, a second PWM modulator PWM2 11B, an auxiliary-signal generating circuit aux_SG 12, a center of gravity phase detector CGPD 13 and a loop filter LF 14. The first PWM modulator 11A is supplied with a usually analog input signal 15A, the second PWM modulator 11B receives a usually analog input signal 15B. The PWM modulators 11A, 11B are self-oscillating PWM modulators which provide pulse-width-modulated output signals +Vout and −Vout, respectively, via output signal lines 16A, 16B.

The required synchronization of the PWM modulators 11A, 11B is effected, for example, via the center of gravity phase detector 13 and the loop filter 14, the structure and operation of which will be described later. As an alternative to the synchronization via the center of gravity phase detector 13 and the loop filter 14, shown in FIG. 2, the synchronization of the self-oscillating PWM modulators 11A, 11B can also be implemented by other measures (for example via load coupling or via coupling of the two PWM modulators 11A, 11B at internal nodes).

For reasons which will be explained later, an auxiliary signal aux is coupled into the PWM modulators 11A, 11B according to an embodiment of the invention. The auxiliary signal aux can be coupled in via auxiliary-signal lines 17A and 17B, respectively, which supply the auxiliary signal to an adder 18A and to a subtractor 18B, respectively, which receives at its other signal input a modulation input signal +Vin and −Vin, respectively, and outputs at its output the input signal 15A and 15B, respectively, for the PWM modulators 11A, 11B. As an alternative, the auxiliary signal aux can also be coupled directly into the PWM modulators 11A and 11B via auxiliary-signal lines 19A and 19B, respectively.

The auxiliary-signal generating circuit 12 can be activated and deactivated, respectively, via a control signal aux_CTRL received via a control signal line 19. The auxiliary signal aux is only generated in the activated state.

If the modulation input signals +Vin, −Vin are analog signals, the auxiliary signal aux is also an analog signal. However, it is also possible that the adder 18A and the subtractor 18B, respectively, and the auxiliary-signal generating circuit 12 are located in a digital signal processing section, the modulation input signals +Vin, −Vin and the auxiliary signal aux being digital signals in this case and digital/analog converters (not shown) being provided on the signal path between the adder 18A and the subtractor 18B, respectively, and the self-oscillating PWM modulators 11A, 11B.

The modulation input signals +Vin, −Vin can be differential signals, i.e., −Vin is generated by inversion (not shown) from +Vin. As an alternative, it is also conceivable, however, that the modulation input signals +Vin, −Vin are mutually independent signals, i.e., that the circuit shown in FIG. 2 has two channels.

The circuit shown in FIG. 2 can be used in a plurality of applications. For example, the circuit can be used as driver circuit for differential signals +Vin, −Vin, e.g., for a two-wire telephone line, particularly as xDSL line driver circuit. In this case, there is also a transmit filter with high-pass characteristic (not shown) between the signal lines to be driven and the output signal lines 16A, 16B. This so-called line converter, which is shown in the illustrative embodiment shown in FIG. 14, blocks DC signal components in the differential output signal +Vout, −Vout.

The output signal +Vout, −Vout delivered by the pulse width modulator circuit 10 is three-valued since both outputs +Vout and −Vout, respectively, can assume the signal values 1 and 0, i.e., the signal generated by subtracting +Vout−(−Vout) can assume the values +1, 0, −1.

Figure 3:
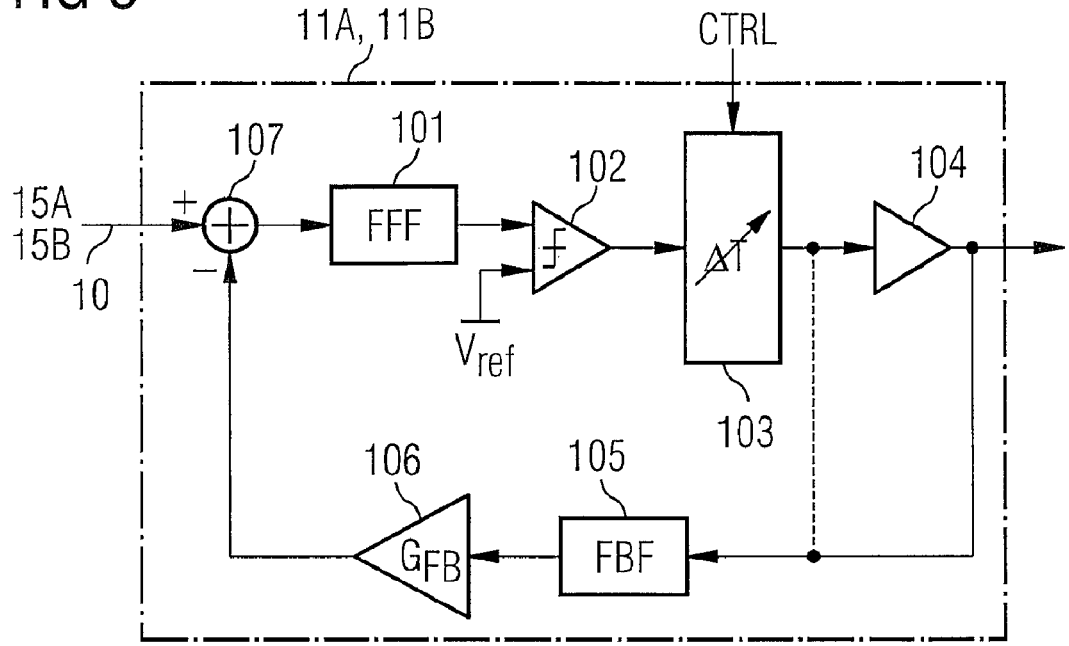
FIG. 3 shows a circuit diagram of a self-oscillating PWM modulator.

FIG. 3 shows an illustrative embodiment of a self-oscillating PWM modulator 11A, 11B contained in the pulse-width modulator circuit 10. The PWM modulator 11A, 11B has a feedforward filter FFF 101, a comparator 102, a delay circuit with controllable delay 103, possibly a power amplifier 104, a feedback filter FBF 105 and a feedback amplifying stage 106. The self-oscillating PWM modulator 11A, 11B also comprises a subtractor 107 which is supplied at its positive input with the input signal 15A and 15B, respectively, and at its negative input with the signal generated in the feedback loop 105, 106. The feedforward filter 101 filters the differential signal generated by the subtractor 107 and forwards the filtered differential signal to the comparator 102 which compares it with a reference voltage Vref. The comparator output signal output by the comparator 102 is delayed in time in the delay circuit 103 in dependence on the synchronization control signal CTRL. The delayed signal is fed back via the feedback loop 105, 106, for example, either after the delay circuit 103 or at the output of the optional power amplifier 104 following the delay circuit 103. If a power amplifier 104 is provided the PWM modulator 11A, 11B is also called SOPA (self-oscillating power amplifier). At the output of the PWM modulator 11A, 11B, the (analog, value-discrete) pulse-width modulated output signal of values 1, 0 is available.

The self-oscillation frequency (i.e., the switching frequency) of the PWM modulator 11A, 11B shown in FIG. 3 is determined by the open-loop phase response of the circuit. The circuit oscillates at a frequency at which a phase shift of 180° occurs. The self-oscillation frequency can be changed by the adjustable phase delay in the delay circuit 103.

It is pointed out that the self-oscillation frequency of a self-oscillating PWM modulator can also be changed in another way. For example, instead of the adjustment of the self-oscillation frequency via the delay circuit 103, described in FIG. 3, the self-oscillation frequency can also be adjusted via a comparator with adjustable hysteresis or via a feedback filter 105 with adjustable bandwidth and possibly at other components of the self-oscillating PWM modulator 11A, 11B.

Figure 4:
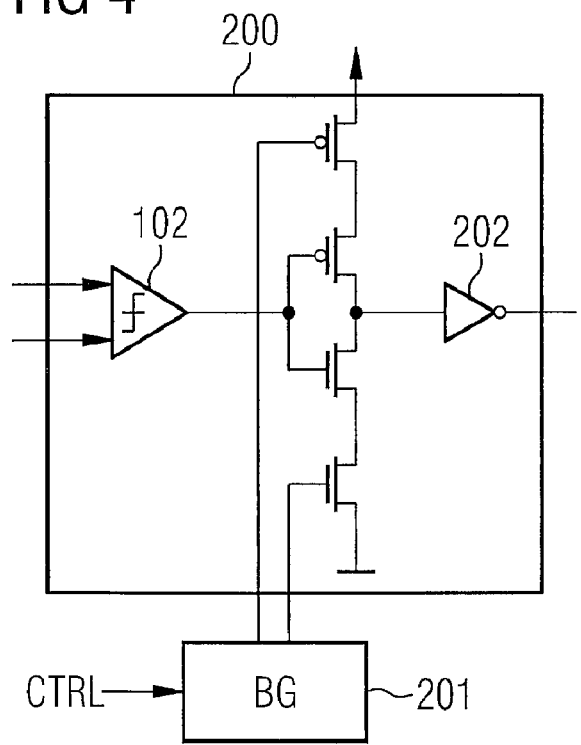
FIG. 4 shows a circuit diagram of a comparator with variable delay in CMOS construction.

The delay circuit 103 can be integrated in the comparator 102. FIG. 4 shows such a comparator with integrated delay circuit 200. The integrated delay circuit consists of a CMOS inverter driven by the comparator 102, the maximum current of which is predetermined in dependence on the control signal CTRL. For this purpose, the gate terminals of complementary MOS field-effect transistors on the drain-source path of the CMOS inverter are suitably driven via a bias generator BG 201 in dependence on the control signal CTRL. If a large tuning range is desired, the time delay can also be effected by other downstream inverters with adjustable delay 202.

Figure 5:
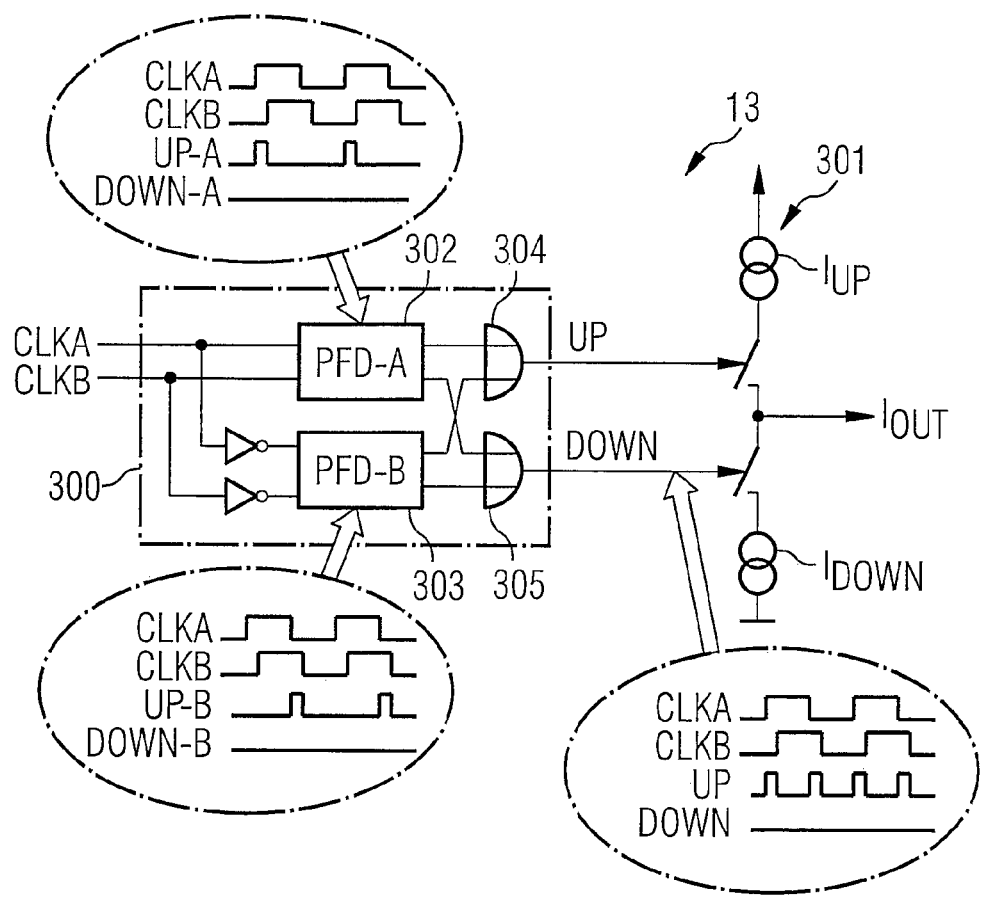
FIG. 5 shows a circuit diagram of a phase/frequency detector for calibrating timing centers of pulses.

FIG. 5 shows an exemplary implementation of the center of gravity phase detector 13 of the pulse width modulator circuit 10 shown in FIG. 2. The center of gravity phase detector 13 consists, for example, of a logic circuit 300 and a charge pump 301 following the logic circuit 300. The logic circuit 300 receives at its two inputs the pulse-width modulated signal CLKA of the PWM modulator 11A transmitted on the output signal line 16A and the pulse-width modulated signal CLKB of the second PWM modulator 11B transmitted on the output signal line 16B. These signals are supplied to a phase/frequency detector PFD-A 302 and, in inverted form, to a phase/frequency detector PFD-B 303. In this arrangement, the first phase/frequency detector 302 is used for determining a phase difference between the rising signal edges of the two pulse-width modulated signals CLKA, CLKB and the second phase/frequency detector 303 is used for determining a negative phase difference between the falling signal edges of the two pulse-width modulated signals CLKA, CLKB. The UP and DOWN pulses of the two phase/frequency detectors 302, 303 are digitally summed in OR gates 304, 305. The output signal UP of the OR gate 304 and the output signal DOWN of the OR gate 305 can be supplied to the charge pump 301 and can be used there, as in a phase locked loop (PLL), for controlling the output current $I_{OUT}$ which results from the currents $I_{UP}$ and $I_{DOWN}$ of the charge pump 301. The output current $I_{OUT}$ of the charge pump 301 can be supplied, as also known from PLL technology, to the loop filter LF 14 which, in the example shown in FIG. 2, outputs a differential output signal CTRL (i.e., more precisely +CTRL and −CTRL).

Figure 6:
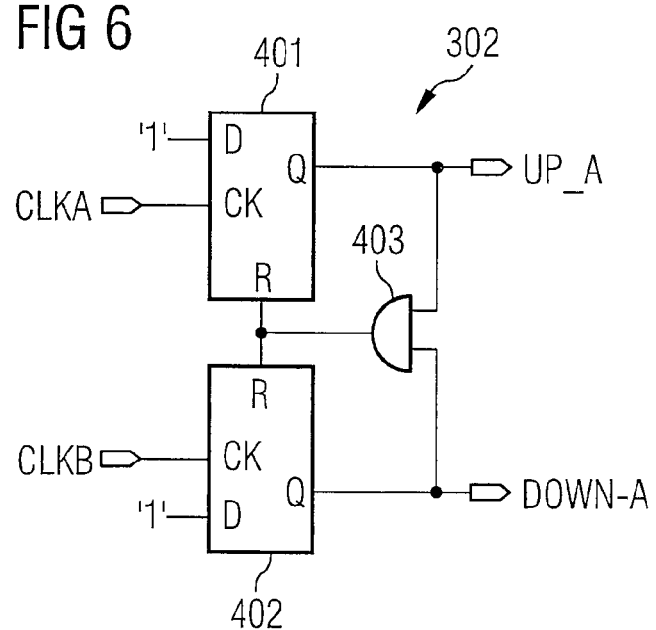
FIG. 6 shows a circuit diagram of a phase/frequency detector.

FIG. 6 shows the identical configuration of the phase/frequency detectors 302, 303 with the example of the phase/frequency detector 302. The phase/frequency detectors 302, 303 comprise two D-type flip-flops 401, 402, the reset inputs R of which are connected to one another and are connected to the output of an AND gate 403. The inputs of the AND gate 403 are connected to the Q outputs UP-A, DOWN-A (for PFD-A 302) and, respectively, UP-B, DOWN-B (for PFD-B 303).

Figure 7:
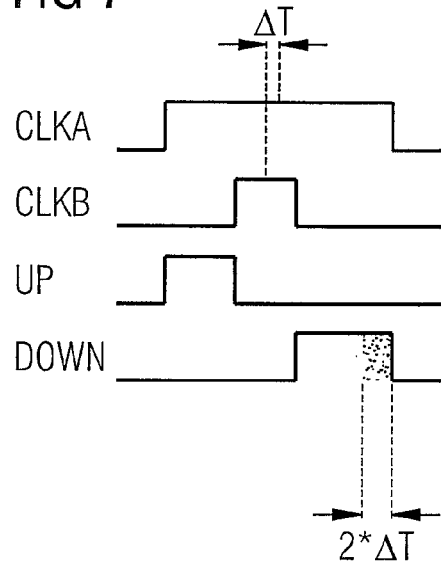
FIG. 7 shows a three-valued PWM signal which represents a DC signal value and is misaligned with respect to the timing centers of the PWM pulses.
Figure 8:
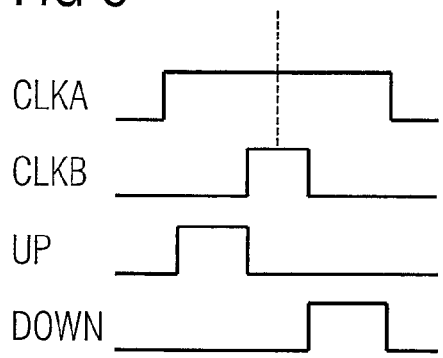
FIG. 8 shows a three-valued PWM signal which represents a DC signal value and is aligned with respect to the timing centers of the PWM pulses.

The operation of the center of gravity phase detector 13 is shown in the signal representations in FIG. 5 and the signal variations shown in FIGS. 7 and 8. FIG. 7 shows signals CLKA and CLKB, the signal pulse centers of which are displaced with respect to one another by ΔT, i.e., exhibit a mismatch. The signals CLKA and CLKB represent a three-valued pulse-width modulated signal of a DC input value with non-synchronized PWM modulators 11A, 11B. The error information of this output signal is coded in the difference of the pulse width of the UP signal and the pulse width of the DOWN signal and thus, in the illustrative embodiment shown in FIG. 5, by the DC component of the output current $I_{OUT}$ of the charge pump 301. According to the known operation of a PLL, the calibration of the PLL (i.e., the correspondence of the signal pulse centers of CLKA and CLKB according to FIG. 8 in the present case, is achieved with an output current $I_{OUT}$ which is forced to the value 0.

Instead of the charge pump 301 a time/digital converter or other circuits can also be used, for example. In general, it applies for synchronized, self-oscillating PWM modulators, that the coupling provided for synchronization (implemented in an exemplary manner by the center of gravity phase detector 13 and the loop filter 14 in the illustrative embodiment shown in FIG. 2) should force the frequency of the self-oscillating PWM modulators to be detuned to 0. In this arrangement, the problem occurs, particularly in PWM modulators which have a power output stage (see the power amplifier 104 in FIG. 3) that at an input signal value of 0, the output signals CLKA (corresponding to +Vout) and CLKB (corresponding to −Vout) have a dead time $\Delta T_{min}$. The occurrence of the dead time $\Delta T_{min}$ appears to be attributable to parasitic coupling effects (e.g., with the power supply). Since the elimination of parasitic coupling effects is associated with great expenditure (more power supply pins, thicker bonding wires, better insulation between the channels and/or the PWM modulators 11A, 11B on the silicon chip), it appears to be difficult to eliminate this dead time effect.

Figure 9:
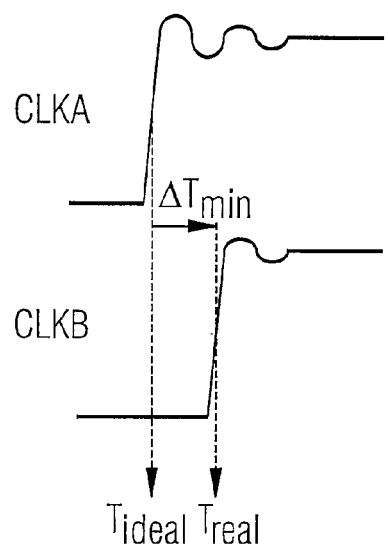
FIG. 9 shows a graphical illustration in which output pulses of synchronized, self-oscillating PWM modulators with a switching dead time are shown.
Figure 10:
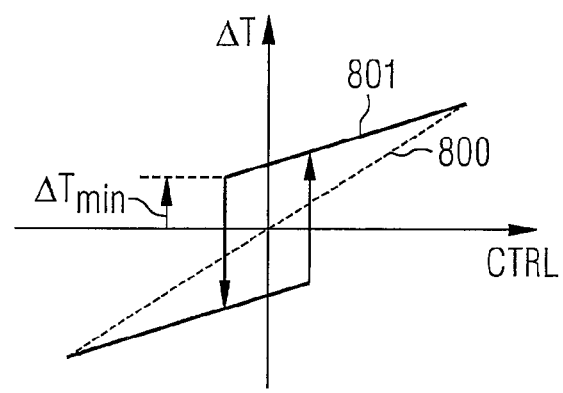
FIG. 10 shows a graphical illustration in which the differential phase delay with respect to a control input signal of the loop filter is shown.

In other words, a minimum time delay $\Delta T_{min}$ always occurs between the output pulses CLKA and CLKB of the two synchronized, self-oscillating PWM modulators 11A, 11B, which, nevertheless, cannot be reduced by changing the control signal CTRL in the correct direction. This means that the differential phase delay of the two self-oscillating PWM modulators 11A, 11B cannot be continuously varied. Instead, the differential phase delay ΔT displays a discontinuous behavior with hysteresis in dependence on the control signal CTRL. This situation is explained in greater detail by means of FIGS. 9 and 10. Without input signal (i.e., with +Vin=−Vin=0), the feedback loop 13, 14 attempts to force the PWM modulators 11A, 11B to switch at exactly the same time (neglecting a possible internal mismatch in the feedback loop 13, 14). The ideal switching time is designated by $T_{ideal}$ in FIG. 9 and represents the switching time of the first PWM modulator 11A (output signal CLKA). On the basis of the operation of the center of gravity phase detector 13 described, and of the control signal CTRL generated in dependence thereon, the second PWM modulator 11B should also switch at time $T_{ideal}$. Instead, its switching time is shifted by $\Delta T_{min}$ to $T_{real}$. The desired characteristic represented by the straight line 800 in FIG. 10 is not achieved, instead of which the hysteresis curve 801 about the value ΔT=0 occurs in practice. The dead time is about ±1 ns (i.e., $\Delta T_{min}$=1 ns).

The consequence of the hysteresis behavior shown in FIG. 10 is that the feedback loop 13, 14 does not function satisfactorily for small input signal levels +Vin, −Vin since it cannot reach its target value ΔT=0. Instead, the system reaches a stable limit cycle, characterized by the hysteresis, and remains there until the input signal is sufficiently large again.

Figure 11:
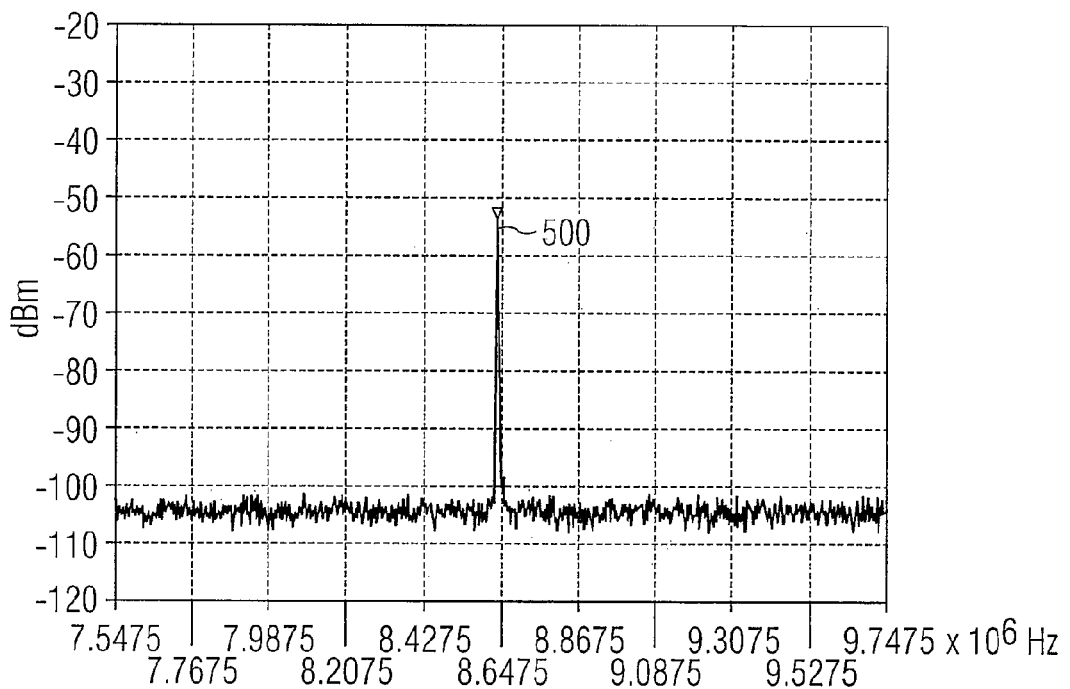
FIG. 11 shows a graphical illustration in which the spectrum of the circuit shown in FIG. 2 with a small input signal and the phase feedback loop switched off is shown.

FIG. 11 shows the measured spectrum of the switching frequency of the pulse width modulation circuit 10 with the two PWM modulators 11A, 11B with the feedback loop 13, 14 switched off. The open-loop frequency peak 500 is at the switching frequency (8.65 MHz in the present case) of the self-oscillating PWM modulators 11A, 11B and is caused by the frequency mismatch of the two PWM modulators 11A, 11B. The frequency synchronization of the self-oscillating PWM modulators 11A, 11B has the aim of suppressing this open-loop frequency peak 500.

Figure 12:
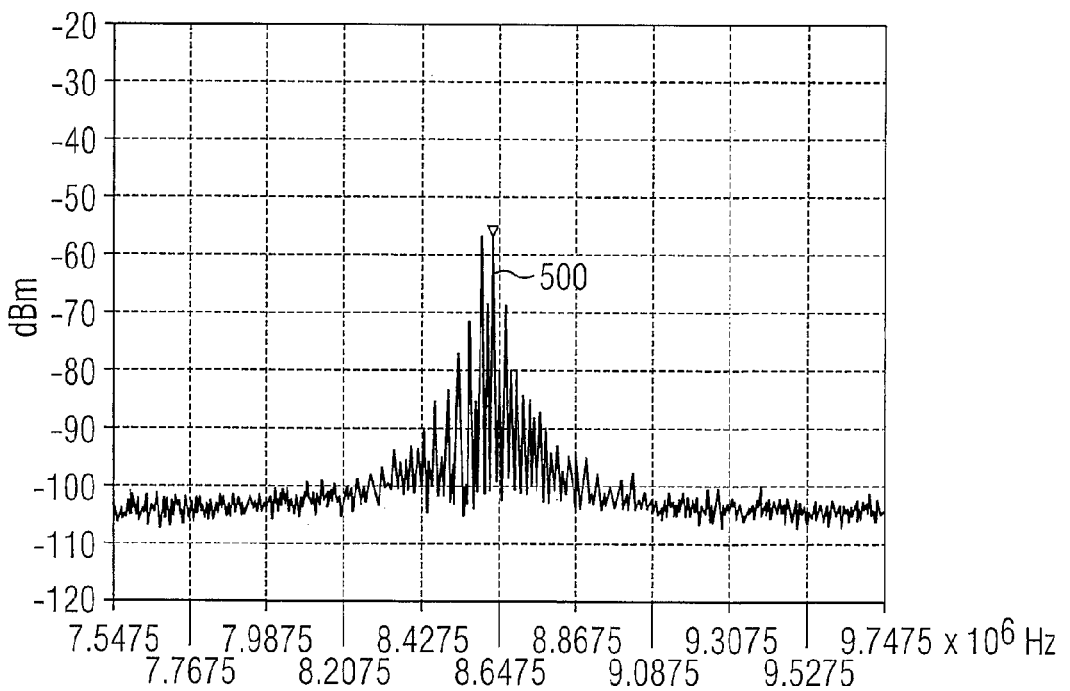
FIG. 12 shows a graphical illustration in which the spectrum of the circuit shown in FIG. 2 with a small input signal and the phase feedback loop switched on is shown.

FIG. 12 shows the measured spectrum of the same system as soon as the feedback loop 13, 14 is switched on. Due to the dead time $\Delta T_{min}$, the feedback loop 13, 14 cannot balance the system to $\Delta T=0$ (i.e., complete correspondence of the signal pulse centers of CLKA and CLKB). The modulation peaks additionally occurring in comparison with FIG. 11 indicate that the system is oscillating in the limit cycle, the open-loop frequency peak 500 only being weakened slightly. In addition, unwanted low-frequency components (not shown) are generated in the output signal.

If the input signal level is increased, the probability the PWM modulators 11A, 11B will switch closely in time is reduced due to the phase modulation components. If the mean (analog) signal level is finally greater (by a certain factor) than the level corresponding to the dead zone, the PLL generated by the feedback loop 13, 14 can settle again. This characteristic (analog) signal level is not only dependent on the width of the dead zone but also on other signal properties such as, for example, the crest factor and the periodicity. It has been found that the probability of the pulse width modulator circuit 10 getting into a limit cycle is greater with a periodic input signal than with a non-periodic input signal.

In general, it can be established that the occurrence of a limit cycle represents a most undesired operation of a three-valued pulse-width modulator circuit frequency-synchronized by feedback, which occurs at small input signal levels or in open-loop operation, i.e., with missing input signals 15A, 15B and causes out-of-band problems.

According to an embodiment of the invention, therefore, the auxiliary signal aux generated by the auxiliary-signal generating circuit 12 is coupled into the signal paths for the PWM modulators 11A, 11B at a suitable point. The auxiliary signal aux coupled in guarantees that the time delay $\Delta T$ between the switching times of the two PWM modulators 11A, 11B is sufficiently large (i.e., especially greater than $\Delta T_{min}$) in order to prevent the system from running into a limit cycle.

As soon as the (desired) input signal levels are sufficiently large, the auxiliary signal aux can be switched off so that the dynamic range of the pulse width modulator circuit 10 is not impaired. It is also possible to provide different types (for example, AC or DC) and/or different levels of the auxiliary signal aux which can be selected in dependence on the currently desired output signal level in order to optimize the system performance.

With an auxiliary signal aux which can be connected or disconnected via the signal control line 19, attention must be paid to the fact that the connecting and disconnecting of the auxiliary signal aux does not disturb the operation of the pulse width modulator circuit 10. Furthermore, it should be guaranteed that the injection of the auxiliary signal aux does not provide any problems for the further signal processing. This can be achieved, for example, due to the fact that the auxiliary signal aux is filtered out by a suitable filter at the output of the pulse width modulator circuit 10 and/or that care is taken at the receiver that the transmitted auxiliary signal aux does not cause any problems.

Figure 13:
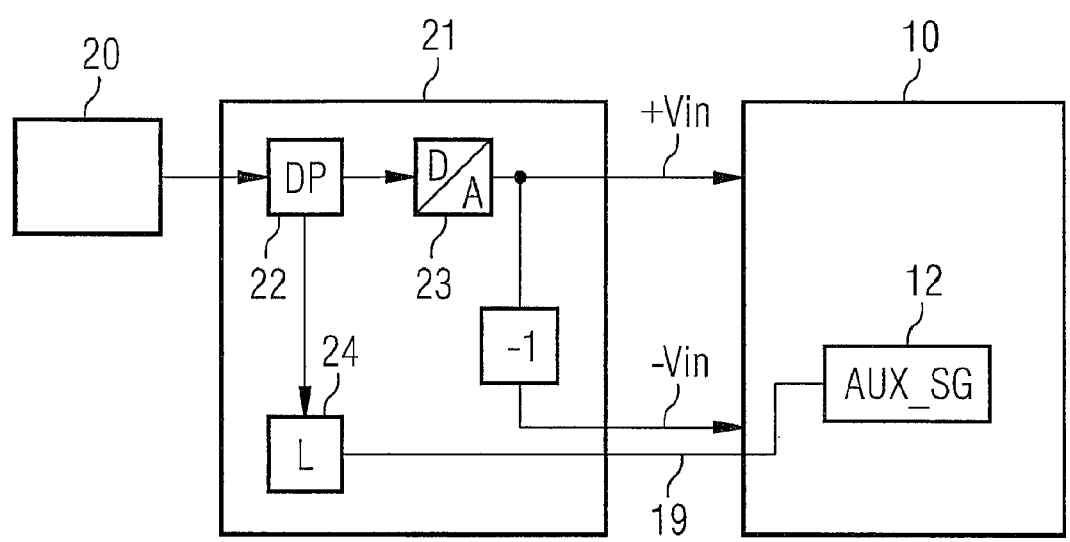
FIG. 13 shows a circuit diagram of a data pump followed by a pulse width modulator circuit.

Various possibilities for arranging and controlling the auxiliary-signal generating circuit 12 are explained by way of example with reference to FIG. 13. FIG. 13 shows a system which is constructed of a data source 20, a data pump 21 and the pulse width modulator circuit 10 already described. The data source 20 can be, for example, a computer. The data pump 21 receives the data signal generated by the data source 20 and carries out data processing in a suitable manner in a data processing circuit DP 22. The output signal of the data processing circuit 22 is supplied to a digital/analog converter 23 and converted into the differential analog data signal +Vin, −Vin at the output of the digital/analog converter 23.

In many applications, the signal level is known at a point on the signal processing path, e.g., in the digital data processing stage 22. In this case, the auxiliary-signal generating circuit 12 can be controlled in a simple manner by providing a control logic L 24 in the data pump 21 which effects the connecting and disconnecting of the auxiliary signal aux via the signal aux_CTRL in dependence on the signal level signalled by the digital data processing circuit 22. In xDSL modems, for example, the level of the transmit signal is agreed during initialization and is then available in the digital data pump 21.

In cases in which the signal level on the data processing path in the system is unknown or is not available in a suitable manner, the signal level can also be measured, in a manner not shown, at the input of the pulse width modulator circuit 10 or at some other suitable node. This measurement value is then supplied to the control logic 24 which controls the auxiliary-signal generating circuit 12. The control logic 24 can also be arranged, in a manner not shown, within the pulse width modulator circuit 10. Although the existence of a measuring circuit increases the amount of circuitry, it decisively increases the out-of-band performance of the circuit in the environment of the self-oscillation frequency (switching frequency) of the PWM modulator circuit 10 at low signal levels, on the other hand.

It is also pointed out that the auxiliary-signal generating circuit 12 can be implemented at a different place on the data processing path, e.g., directly in the digital data pump 21. Arranging the auxiliary-signal generating circuit 12 in the data pump 21 is a cost-effective solution since the pulse-width modulator circuit 10 needs to be modified only slightly in this case. The prerequisite for this is, however, that the auxiliary signal aux is located in the passband of the signal transmission path between the data pump 21 and the pulse-width modulator circuit 10 so that it reaches the pulse width modulator circuit 10. Since the pulse width modulator circuit 10 is AC-coupled to the digital/analog converter 23 of the data pump 21 in xDSL systems (i.e., a DC auxiliary signal is not transmitted into the pulse width modulator circuit 10) and furthermore coupling-in of AC signals is not permissible in xDSL systems, the auxiliary-signal generating circuit 12 will usually be accommodated in the pulse-width modulator circuit 10 in xDSL line driver applications.

If the coupling-in and transmission of an AC auxiliary signal does not contravene the system specifications, it is generally to be preferred to coupling-in and transmitting a DC auxiliary signal since the operating behavior of the output stage (particularly of the power amplifiers 104) is better with respect to linearity and power consumption when there is no DC component. An auxiliary-signal generating circuit 12 for an AC auxiliary signal can also be implemented as an integrated circuit on the chip and couple the auxiliary signal into the pulse width modulator circuit 10 into a suitable voltage or current node in the same manner as in the case of a DC auxiliary signal.

For an AC auxiliary signal, too, it applies that it must not interfere with the transmit signal to be transmitted after the transmit filter and that it must not contravene the system specifications with regard to the transmission spectrum (out-of-band spectrum mask).

Figure 14:
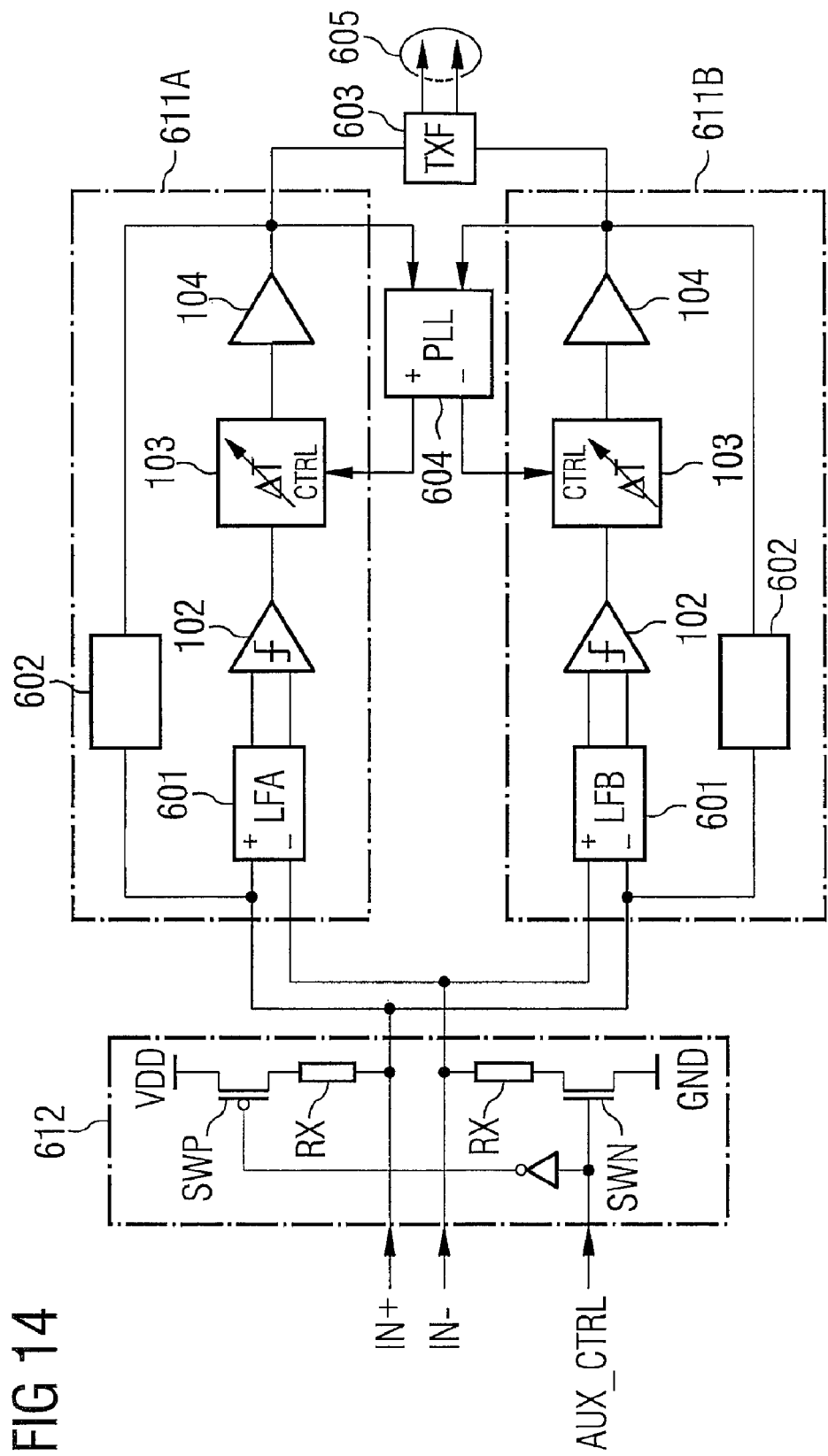
FIG. 14 shows a circuit diagram of a further illustrative embodiment of the invention.

FIG. 14 shows the circuit configuration of an xDSL line driver according to a further illustrative embodiment of the invention. The circuit comprises two PWM modulators 611A, 611B arranged in the manner of SOPAs. The same reference symbols are used for the same components or functionally similar components as in the preceding figures. The PWM modulators 611A, 611B essentially only differ from the PWM modulators 11A, 11B shown in FIG. 2 in that they have a differential input. A feedback network 602 provides for the self oscillation of the PWM modulators 611A, 611B. Loop filters LFA, LFB 601 with differential input and output receive the input signal and deliver at their outputs the two input signals for the comparator 102. At the output end of the two PWM modulators 611A, 611B, a transmit filter TXF 603 with high-pass characteristic (so-called line transformer) is arranged. The transmit filter 603 feeds the filtered signal into the xDSL two-wire lines 605.

The two PWM modulators 611A, 611B are preferably synchronized by a pulse center alignment in the manner already described. The pulse center alignment is produced by the phase feedback loop circuit PLL 604 which, in accordance with the preceding description, can contain, for example, a center of gravity phase detector 13 and a loop filter 14.

Coupling of an auxiliary signal into the PWM modulators 611A, 611B is effected via the auxiliary-signal generating circuit 612. At low transmit signal levels, the two switches SWP (p-channel MOSFET) and SWN (n-channel MOSFET) are switched to conduct, as a result of which the resistor RX associated with the switch SWP is connected to a positive supply or reference voltage and the resistor RX associated with the switch SWN is connected to a negative supply or reference voltage. As a result, a DC signal is coupled into the input of the PWM pulse modulator circuit 611A, 611B. The DC component of the transmit signal is blocked by the transmit signal filter 603.

The auxiliary-signal generating circuit 612 can be designed for generating an auxiliary signal having a number of different DC levels. For this purpose, for example, further chains of resistors RX and switches SWP, SWN can be arranged in parallel with the chain shown. Another possibility consists in connecting the switches SWP, SWN not to a fixed differential voltage (the voltage between VDD and GND in FIG. 14) but to a programmable differential voltage source for generating different differential voltages. Such arrangements provide for a more flexible adjustment of the levels of the DC auxiliary signal aux.

Figure 15:
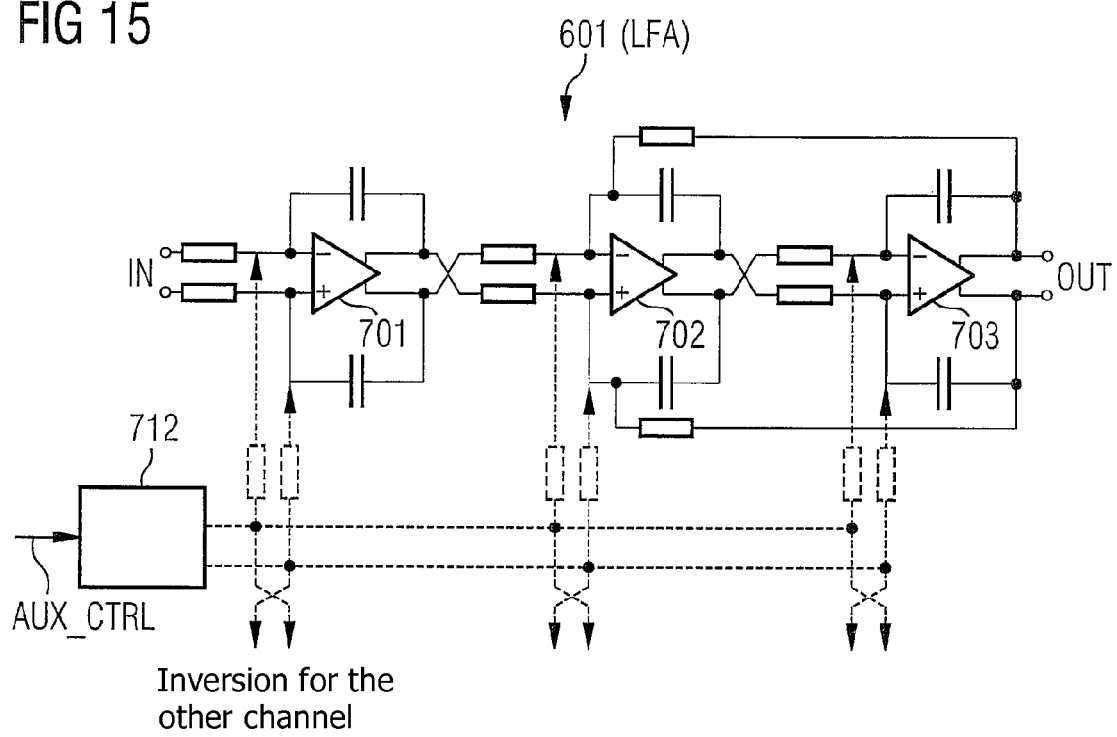
FIG. 15 shows a circuit diagram of an active RC loop filter for coupling the auxiliary signal into the loop filter of the self-oscillating PWM modulators according to an alternative variant of the embodiment from FIG. 14.

As already mentioned, the auxiliary signal can also be coupled into the PWM modulators 11A, 11B or 611A, 611B, respectively, at another point. One possibility consists in coupling the auxiliary signal into the loop filters 601. If the loop filters 601 are implemented, for example, as active operational amplifier RC filters, any pair of virtual ground nodes can be used for injecting a suitable signal current. FIG. 15 shows in illustrative manner a third-order loop filter 601 of the type mentioned. The loop filter 601 comprises three operational amplifiers 701, 702, 703 with a respective circuitry of resistors and capacitors. The current is injected via the current path shown dashed at the positive and negative (inverting) inputs of the operational amplifiers 701, 702, 703. The individual injection nodes can be activated or deactivated, respectively, by switches in a manner not shown. For the loop filter 601 of the other PWM modulator 611B (this loop filter is designated by LFB in FIG. 14), the auxiliary signals must be inverted. In a completely differential implementation, this can be done simply by cross-connecting the injection nodes associated with one another. The positive auxiliary signal delivered by the auxiliary-signal generating circuit 712 is thus supplied to the positive input of the operational amplifiers 701, 702, 703 in the loop filter LFA and to the negative input of the operational amplifiers 701, 702, 703 in the loop filter LFB.

What is claimed is:

1. A pulse width modulator circuit comprising:
two self-oscillating pulse width modulators;
a synchronization circuit for synchronizing the two self-oscillating pulse width modulators; and
an auxiliary-signal generating circuit for generating an auxiliary signal that is coupled into the two self-oscillating pulse width modulators.

2. The pulse width modulator circuit according to claim 1, wherein the auxiliary-signal generating circuit superimposes the auxiliary signal on input signals of the self-oscillating pulse width modulators.

3. The pulse width modulator circuit according to claim 1, wherein the auxiliary-signal generating circuit couples the auxiliary signal into the self-oscillating pulse width modulators separately from the input signals.

4. The pulse width modulator circuit according to claim 3, wherein:
the self-oscillating pulse width modulators have loop filters; and
the auxiliary-signal generating circuit couples the auxiliary signal into the self-oscillating pulse width modulators via the loop filters.

5. The pulse width modulator circuit according to claim 1, wherein the pulse width modulator circuit couples the auxiliary signal generated by the auxiliary-signal generating circuit to the self-oscillating pulse width modulators only when a signal level of one or both input signals of the self-oscillating pulse width modulators is below a threshold value.

6. The pulse width modulator circuit according to claim 5, wherein the pulse width modulator circuit comprises a measuring circuit for determining the signal level of one or both input signals.

7. The pulse width modulator circuit according to claim 1, wherein the auxiliary-signal generating circuit generates a DC auxiliary signal.

8. The pulse width modulator circuit according to claim 1, wherein the auxiliary-signal generating circuit generates an AC auxiliary signal.

9. The pulse width modulator circuit according to claim 1, wherein the synchronization circuit comprises:
a phase offset detector for determining a quantity that is characteristic of a skew between signal pulse centers of signals generated by the self-oscillating pulse width modulator; and
a frequency control circuit for adjusting frequencies of the self-oscillating pulse width modulators based on the quantity determined.

10. A three-valued pulse width modulator, comprising:
two self-oscillating pulse width modulators;
a synchronization circuit for synchronizing the two self-oscillating pulse width modulators;
a circuit for combining two-valued pulse-width modulated signals generated by the two self-oscillating pulse width modulators into a three-valued pulse-width modulated signal; and
an auxiliary-signal generating circuit for generating an auxiliary signal that is coupled into the two self-oscillating pulse width modulators.

11. The three-valued pulse width modulator according to claim 10, wherein the auxiliary-signal generating circuit superimposes the auxiliary signal on input signals of the self-oscillating pulse width modulators.

12. The three-valued pulse width modulator according to claim 10, wherein the auxiliary-signal generating circuit couples the auxiliary signal into the self-oscillating pulse width modulators separately from the input signals.

13. The three-valued pulse width modulator according to claim 12, wherein:
the self-oscillating pulse width modulators have loop filters; and
the auxiliary-signal generating circuit couples the auxiliary signal into the self-oscillating pulse width modulators via the loop filters.

14. The three-valued pulse width modulator according to claim 10, wherein the three-valued pulse width modulator couples the auxiliary signal generated by the auxiliary-signal generating circuit into the self-oscillating pulse width modulators only when a signal level of one or both input signals of the self-oscillating pulse width modulators is below a threshold value.

15. The three-valued pulse width modulator according to claim 14, wherein the pulse width modulator circuit comprises a measuring circuit for determining the signal level of one or both input signals.

16. The three-valued pulse width modulator according to claim 10, wherein the synchronization circuit comprises:
a phase offset detector for determining a quantity that is characteristic of a skew between signal pulse centers of signals generated by the self-oscillating pulse width modulators; and
a frequency control circuit for adjusting frequencies of the self-oscillating pulse width modulators based on the quantity determined.

17. A pulse width modulator circuit comprising:
two self-oscillating pulse width modulators;
a synchronization circuit that is coupled to synchronization inputs of the two self-oscillating pulse width modulators and synchronizes these; and
an auxiliary-signal generating circuit, outputs of which are coupled to signal inputs of the self-oscillating pulse width modulators and couples an auxiliary signal into the signal inputs of the self-oscillating pulse width modulators.

18. The pulse width modulator circuit according to claim 17, wherein the pulse width modulator circuit couples the auxiliary signal generated by the auxiliary-signal generating circuit into the self-oscillating pulse width modulators only when the signal level of one or both input signals of the self-oscillating pulse width modulators is below a threshold value.

19. The pulse width modulator circuit according to claim 18, wherein the synchronization circuit comprises:
a phase offset detector for determining a quantity that is characteristic of a skew between signal pulse centers of signals generated by the self-oscillating pulse width modulators; and
a frequency control circuit for adjusting frequencies of the self-oscillating pulse width modulators in dependence on the quantity determined.

20. A pulse width modulator circuit comprising:
two self-oscillating pulse width modulators;
a synchronization circuit that is coupled to synchronization inputs of the two self-oscillating pulse width modulators; and
an auxiliary-signal generating circuit, outputs of the auxiliary signal generating circuit being coupled to auxiliary-signal inputs of the self-oscillating pulse width modulators, in order to couple an auxiliary signal into the self-oscillating pulse width modulators, the auxiliary-signal inputs being separate from signal inputs of the self-oscillating pulse width modulators.

21. The pulse width modulator circuit according to claim 20, wherein the pulse width modulator circuit couples the auxiliary signal generated by the auxiliary-signal generating circuit into the self-oscillating pulse width modulators only when the signal level of one or both input signals of the self-oscillating pulse width modulators is below a threshold value.

22. The pulse width modulator circuit according to claim 20, wherein the synchronization circuit comprises:
a phase offset detector for determining a quantity that is characteristic of a skew between signal pulse centers of signals generated by the self-oscillating pulse width modulators; and
a frequency control circuit for adjusting frequencies of the self-oscillating pulse width modulators based on the quantity determined.

23. A circuit arrangement comprising:
a digital data pump;
a digital/analog converter following the digital data pump; and
a pulse width modulator circuit, following the digital/analog converter, the pulse width modulator comprising:
two self-oscillating pulse width modulators; and
a synchronization circuit for synchronizing the two self-oscillating pulse width modulators, wherein:
an auxiliary-signal generating circuit for generating an auxiliary signal that is coupled into the two self-oscillating pulse width modulators is provided in a digital data pump.

24. A method for the pulse width modulation of two signals, the method comprising:
supplying two signals to a self-oscillating pulse width modulator;
coupling an auxiliary signal into the two self-oscillating pulse width modulators; and
synchronizing the two self-oscillating pulse width modulators using the auxiliary signal.

25. The method according to claim 24, wherein the auxiliary signal is superimposed on the input signals of the self-oscillating pulse width modulators.

26. The method according to claim 24, wherein the auxiliary signal is coupled into the self-oscillating pulse width modulators via auxiliary-signal inputs that are provided additionally to the inputs of the input signals.

27. The method according to claim 24, wherein the auxiliary signal is coupled into the self-oscillating pulse width modulators only when the signal level of at least one or both input signals of the self-oscillating pulse width modulators is below a threshold value.

28. A method for generating a three-valued pulse-width modulated signal from two input signals, the method comprising:
supplying each input signal to a self-oscillating pulse width modulator;
coupling an auxiliary signal into the two self-oscillating pulse width modulators;
synchronizing the two self-oscillating pulse width modulators; and
combining the output signals of the self-oscillating pulse width modulators to generate the three-valued pulse-width modulated signal.

* * * * *